(12) United States Patent
Xu et al.

(10) Patent No.: US 11,063,669 B2
(45) Date of Patent: Jul. 13, 2021

(54) DUAL-RATE DML DEVICE AND MODULE HAVING BUILT-IN SIGNAL CALIBRATION CIRCUIT, AND SIGNAL CALIBRATION METHOD

(71) Applicant: Accelink Technologies Co., Ltd., Wuhan (CN)

(72) Inventors: Hongchun Xu, Wuhan (CN); Yangyang Yue, Wuhan (CN); Chenggang Liu, Wuhan (CN); Xiaoping Song, Wuhan (CN); Xue Mei, Wuhan (CN); Hui Zou, Wuhan (CN); Yuan Zhang, Wuhan (CN)

(73) Assignee: Accelink Technologies Co., Ltd.

( * ) Notice: Subject to any disclaimer, the term of this patent is extended or adjusted under 35 U.S.C. 154(b) by 130 days.

(21) Appl. No.: 16/491,939

(22) PCT Filed: Dec. 25, 2017

(86) PCT No.: PCT/CN2017/118164
§ 371 (c)(1),
(2) Date: Sep. 6, 2019

(87) PCT Pub. No.: WO2018/161686
PCT Pub. Date: Sep. 13, 2018

(65) Prior Publication Data
US 2020/0076509 A1    Mar. 5, 2020

(30) Foreign Application Priority Data

Mar. 7, 2017 (CN) .......................... 201710131223.5

(51) Int. Cl.
*H01S 5/0683*    (2006.01)
*H04B 10/50*    (2013.01)
(Continued)

(52) U.S. Cl.
CPC ......... *H04B 10/504* (2013.01); *H01S 5/0265* (2013.01); *H01S 5/02415* (2013.01); *H01S 5/02469* (2013.01); *H01S 5/0683* (2013.01)

(58) Field of Classification Search
CPC ... H01S 5/0265; H01S 5/0683; H01S 5/06832
See application file for complete search history.

(56) References Cited

U.S. PATENT DOCUMENTS 5,825,792 A    10/1998 Villeneuve et al.
9,385,830 B2 *    7/2016 Sato .................. H04J 14/02
(Continued)

FOREIGN PATENT DOCUMENTS

CN    1553548 A    12/2004
CN    104904142 A    9/2015
(Continued)

OTHER PUBLICATIONS

International Search Report for PCT/CN2017/118164, dated Mar. 28, 2018.
(Continued)

*Primary Examiner* — Michael Carter
(74) *Attorney, Agent, or Firm* — Lerner, David, Littenberg, Krumholz & Mentlik, LLP

(57) ABSTRACT

The present invention relates to a technical field of optical communications. It relates to a dual-rate DML device and module, and a calibration method, and in particular, to a dual-rate DML device and module having a built-in signal calibration circuit, and a calibration method. According to the present invention, the signal calibration circuit is added into the device; a PD is prepositioned by means of a novel light splitting structure; a control structure for a sequence-divided multi-channel serial signal is utilized to feed back a monitoring signal to an electric driver to adjust drive current; crosstalk between backlight monitoring is reduced; and (Continued)

high-quality signal output under dual modulation frequencies of 25 Gbps and 28 Gbps is realized.

9 Claims, 4 Drawing Sheets

(51) Int. Cl.
 *H01S 5/024* (2006.01)
 *H01S 5/026* (2006.01)

(56) References Cited

U.S. PATENT DOCUMENTS

| | | |
|---|---|---|
| 2002/0076132 A1 | 6/2002 | Peral et al. |
| 2003/0007534 A1 | 1/2003 | Kanemaru et al. |
| 2007/0237194 A1 | 10/2007 | Shahine |
| 2010/0061737 A1 | 3/2010 | Kato |
| 2010/0124423 A1* | 5/2010 | Kagaya .............. H04B 10/40 398/182 |
| 2013/0077646 A1 | 3/2013 | Kan et al. |
| 2015/0103491 A1* | 4/2015 | Ma .................. H05K 1/183 361/715 |
| 2015/0311671 A1 | 10/2015 | Bhullar |
| 2016/0127038 A1 | 5/2016 | Liao et al. |
| 2016/0226217 A1 | 8/2016 | Jia et al. |

FOREIGN PATENT DOCUMENTS

| | | |
|---|---|---|
| CN | 105048993 A | 11/2015 |
| CN | 105897343 A | 8/2016 |
| CN | 106054327 A | 10/2016 |
| CN | 106998230 A | 8/2017 |
| EP | 0061034 A1 | 9/1982 |
| EP | 2843855 A1 | 3/2015 |
| EP | 3076569 A1 | 10/2016 |
| WO | 2007103669 A2 | 9/2007 |
| WO | 2016101125 A1 | 6/2016 |

OTHER PUBLICATIONS

First Office action of priority application No. CN201710131223.5. filed Mar. 7, 2017.

Extended European Search Report including Written Opinion for EP17899523.9 dated Dec. 8, 2020; 10 pages.

* cited by examiner

DUAL-RATE DML DEVICE AND MODULE HAVING BUILT-IN SIGNAL CALIBRATION CIRCUIT, AND SIGNAL CALIBRATION METHOD

CROSS REFERENCE TO RELATED APPLICATIONS

The present application is a national phase entry under 35 U.S.C. § 371 of International Application PCT/CN2017/118164 filed Dec. 25, 2017, which claims priority from Chinese Patent Application No. 201710131223.5 filed Mar. 7, 2017, all of which are incorporated herein by reference.

TECHNICAL FIELD

The present invention relates to a technical field of optical communications. The present invention relates to a dual-rate DML device and module, and a calibration method, and in particular, to a dual-rate DML device and module having a built-in signal calibration circuit (SCC for short), and a calibration method.

BACKGROUND

With a continuous improvement of global bandwidth demand, a continuous expansion of application fields of optical communication industry, such as data center and security monitoring and the like, and a large-scale construction of backbone networks and access networks, an optical module industry has ushered in new market opportunities. Especially in recent years, with the rise of cloud computing, video applications, Internet games, social networks and other applications, Internet traffic has multiplied exponentially, and routers facing a "100 G platform" are gradually replacing an original 10 G status and become a new core network. This has become an important driving force for a development of 100 G transmission technology. Compared with the traditional 10 G transmission equipment, the 100 G transmission technology not only has higher integration, but also may effectively utilize the transmission characteristics of optical fiber, saving space resources and optical cable resources.

At present, there are two main types of laser modulation modes used in the field of optical communication: a direct modulation laser mode (directly modulated semiconductor laser, DML for short) and an electro-absorption modulation laser mode (electro-absorption modulated laser, EML for short). The direct modulation laser mode is a relatively common laser modulation method. Devices and modules fabricated by the direct modulation laser mode have a long application history and a wide range of applications, and such characteristics determine that both an optical chip and an electrical chip have a more complete supply and quality system, stable accessibility and stable quality output, which determines the low cost and high performance price ratio of direct modulation lasers.

However, since the modulation signal of a DML laser is directly applied to a laser chip, a varying input current may cause degradation of the output characteristics of the laser chip, and the higher the frequency of variation is, the more obvious the deterioration is, and in the era of 40 G and before 40 G, such deterioration does not affect the transmission and extraction of signals, however, in the era of 100 G, it cannot be ignored for the influence of such deterioration on signal transmission and extraction.

SUMMARY

The present invention mainly solves the problem of DML signal deterioration in a high-speed transmission mode existing in the prior art, and proposes a dual-rate DML device and module having a built-in signal calibration circuit. According to this structure, the signal calibration circuit is added into the device; a PD is prepositioned by means of a novel light splitting structure; crosstalk between backlight monitoring is reduced; a signal calibration function is realized in the device through high-integration multistage amplification, equalization chip parameter configuration, and adjustment of bonding length and angle between the laser chip and a laser die, thus high-quality signal output under double modulation frequencies of 25 Gbps and 28 Gbps is realized; and signal pins is reduced through a control structure of a serial signal.

In order to solve the above problems, according to one aspect of the present invention, it provides a dual-rate DML device having a built-in signal calibration circuit, comprising:

a signal calibration circuit, which is built into the DML device for calibrating a degraded signal and directly connected a laser chip through a gold wire.

Optionally, the above mentioned dual-rate DML device having a built-in signal calibration circuit comprises:

a collimating lens for converting a light source of the laser chip into parallel light;

a light splitting structure for reflecting and converging a portion of the parallel light onto a PD photosensitive surface; and a PD array comprising a plurality of said PD photosensitive surfaces, each of the PD photosensitive surfaces being respectively connected to a data input port of a serial port control structure, the serial port control structure being connected with the signal calibration circuit for driving the laser chip.

Optionally, the above mentioned dual-rate DML device having a built-in signal calibration circuit, wherein a surface, generating transmission and reflection of light, of the light splitting structure is located on an inclined surface formed by a diagonal line, and the PD array is located above the inclined surface.

Optionally, the above mentioned dual-rate DML device having a built-in signal calibration circuit, wherein a gold wire bonding length between the signal calibration circuit and the laser chip is 0.1 mm to 2 mm, and a bending angle is between 45° and 135°.

Optionally, the above mentioned dual-rate DML device having a built-in signal calibration circuit, wherein the light splitting structure is also used to transmit and converge a portion of the parallel light into an optical fiber.

Optionally, the above mentioned dual-rate DML device having a built-in signal calibration circuit, further comprising a heat sink connected to an independent temperature control element TEC, the laser chip, the collimating lens, and the PD array being successively arranged on the heat sink, and a glass gasket being set between the collimating lens and the heat sink.

In order to solve the above problems, according to another aspect of the present invention, it provides a dual-rate DML module having a built-in signal calibration circuit, which comprises any one of the above mentioned DML device.

In order to solve the above problems, according to still another aspect of the present invention, it provides a signal calibration method of a dual-rate DML device having a built-in signal calibration circuit, comprising:

a light splitting step, converting a light source of a laser chip into parallel light, and reflecting and converging a portion of the parallel light onto a PD array, wherein a PD photosensitive surface of the PD array is respectively connected to a data input port of a serial port control structure; and a feedback control step, deriving a signal from the PD array using the serial port control structure and delivering the signal to a signal calibration circuit which is built into the DML device and directly connected to the laser chip via a gold wire, to adjust light intensity.

Optionally, the above mentioned signal calibration method of a dual-rate DML device having a built-in signal calibration circuit, wherein in the feedback control step, the signals from the PD array are all output by a clock signal applied on a clock port of the serial port control structure and a voltage applied on a power port.

Optionally, the above mentioned signal calibration method of a dual-rate DML device having a built-in signal calibration circuit, wherein in the feedback control step, the signals from the PD array are read in time sequence.

Therefore, the present invention has the following advantages:

1. realizing the signal calibration function in the device through high-integration multistage amplification, equalization chip parameter configuration, together with adjustment of bonding length and angle between the laser chip and the laser die;

2. placing PD in a prepositioning mode, leaving valuable space for the signal calibration circuit to be placed on the back of the laser chip, and when there is multiple parallel light, there will be no crosstalk between different backlight monitoring;

3. using a serial port control mode to read the PD feedback current, and the numerical value of different chips can be read in sequence by the mode of time division multiplexing, and only several basic pins of power, data and clock need to be led out, thus reducing the output pins of the device;

4. adding a transition block between the signal calibration circuit and the TEC, which thus may improve the heat dissipation performance of the device and may reduce the power consumption of the device.

Reference signs: 1—tube shell; 2—ceramic substrate; 3—tube cover; 4—signal calibration circuit; 5—transition block; 6—laser chip; 7—collimating lens; 8—glass gasket; 9—heat sink; 10—independent temperature control element; 11—PD array; 12 light splitting structure; 13—converging lens; 14—data output port; 15—clock port; 16 power port; 17—serial port control structure; 18—data input port; 19—first gold wire; 20—second gold wire; 21—third gold wire.

DESCRIPTION OF EMBODIMENTS

The technical solutions of the present disclosure are further described below with reference to the embodiments and the drawings.

Embodiment

In this embodiment, a signal calibration circuit is built into the device, and a signal calibration function is added to calibrate a deteriorated signal with a highly integrated multistage amplification chip and an equalization driver.

Figure 1:
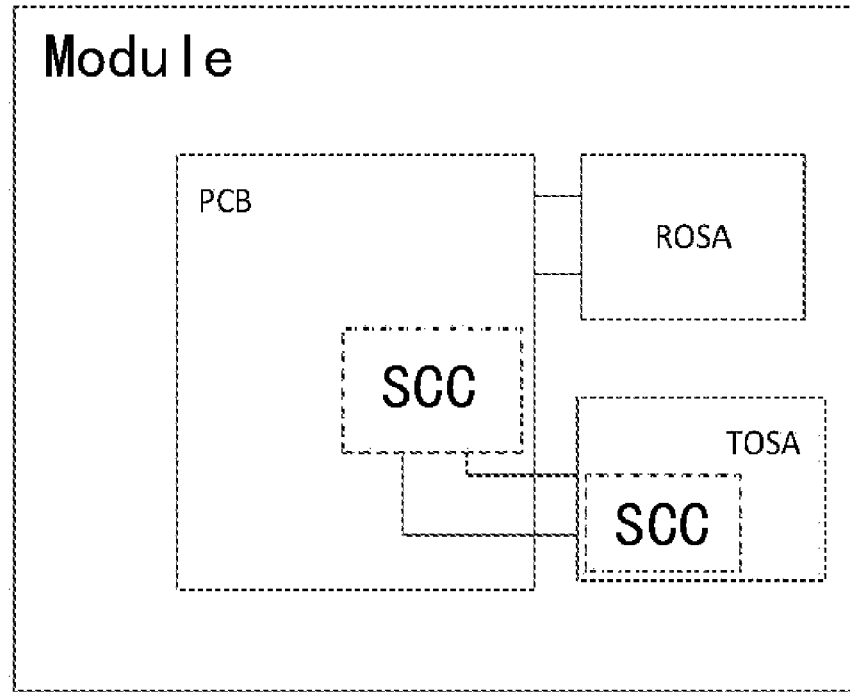
FIG. 1 is a structural block diagram showing a signal calibration circuit being positioned in different positions inside the DML module.

FIG. 1 is a structural block diagram showing a signal calibration circuit being positioned in different positions. A laser chip 6 is located inside the device, and if a signal calibration circuit is built in the device, the spacing between the signal calibration circuit 4 and the laser chip 6 can be effectively reduced, which is advantageous for improving the impedance matching degree of the high frequency signal and finally improving the output signal quality under the conditions of the two rates of 25 Gbps and 28 Gbps.

Figure 2:
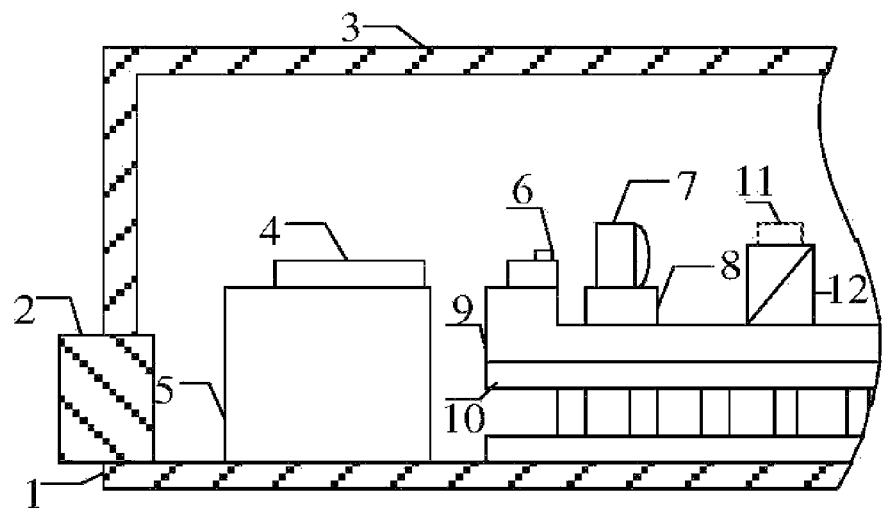
FIG. 2 is a front view showing a main structure inside a DML device.
Figure 3:
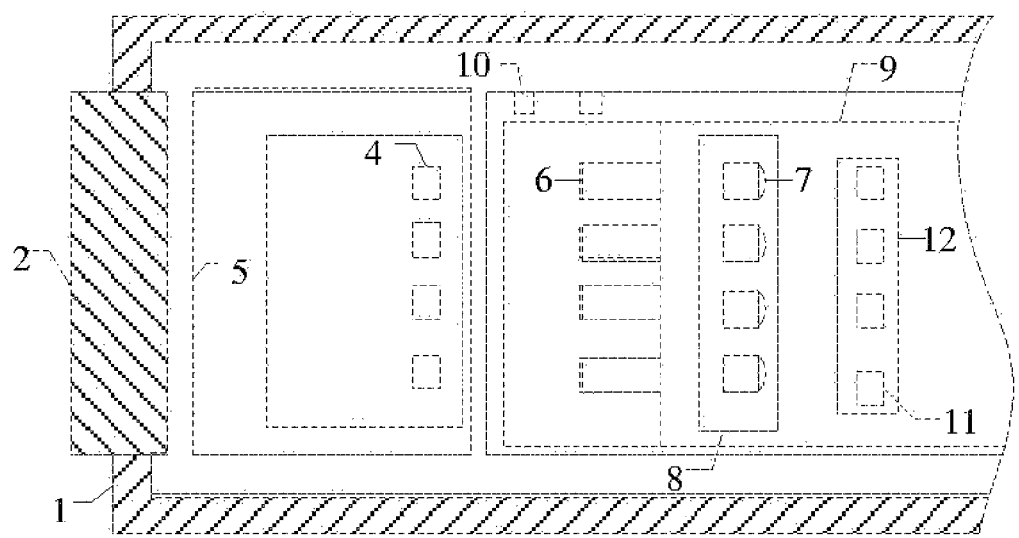
FIG. 3 is a top view showing a main structure inside a DML device.

The position of elements within the device of the present invention is shown in FIG. 2 and FIG. 3. An independent temperature control element 10 is placed on the bottom of tungsten copper tube shell 1, and a tungsten copper heat sink 9 is placed on the upper surface of the independent temperature control element 10, the laser chip 6, a lens assembly 7, a PD array 11, and some of subsequent elements are placed successively from the left to the right on the tungsten copper heat sink 9 to form an optical path. The signal calibration circuit 4 is placed at the front end of the laser chip 6. After the signal calibration circuit 4 is built in, the distance between the signal calibration circuit 4 and the laser chip 6 is directly reduced, and by controlling the length and curvature of the gold wire, the parasitic capacitance and parasitic inductance of the device can be reduced, the impedance compatibility can be increased, and the signal quality can be effectively improved.

In addition, in order to improve the overall heat dissipation performance of the device and solve the problem of power consumption of the signal calibration circuit, as shown in FIG. 2, a transition block 5 with appropriate size is added under the signal calibration circuit 4, on one hand, the ground (GND) of the signal calibration circuit 4 is isolated from the ground (GND) of the tube shell, and on the other hand, the heat dissipation of the device is accelerated.

Figure 4:
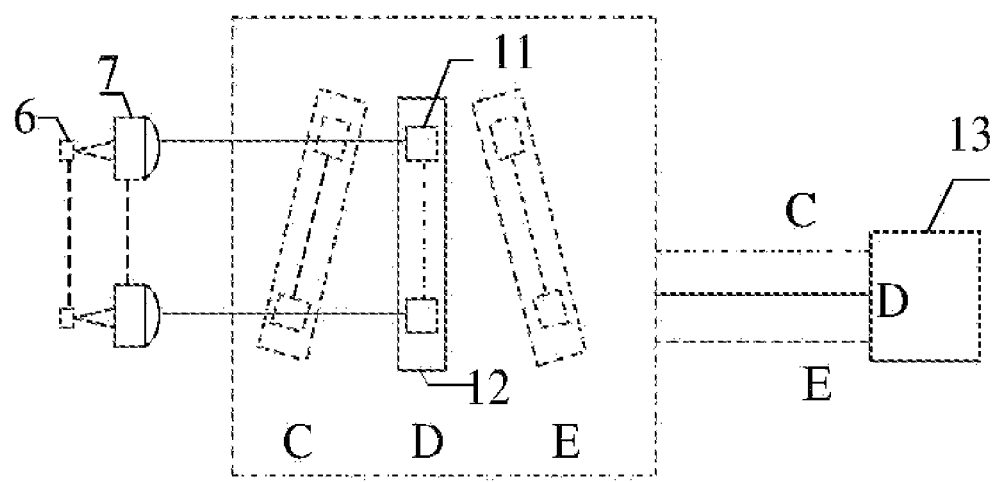
FIG. 4 is a top view showing a portion of an amplified optical path within a DML device associated with a monitoring unit and a light splitting structure.

FIG. 4 is a top view schematic diagram showing a portion of the amplified optical path within a device associated with a monitoring unit PD and a light splitting structure, firstly, an external power supply is used for supplying power to enable the laser chip 6 to emit light normally, and parallel light is formed after passing through the collimating lens 7, and then, after passing through a novel partially transmissive and partially reflected light splitting structure 12, a reflected portion of parallel light is converged on a PD photosensitive surface; a transmitted portion of parallel light is directly converged into the optical fiber through the rear lens.

Compared with the arrangement mode that the PD is placed at the rear end of the laser chip, this mode is not only no longer affected by the distance between the PD and a laser die, but also provides enough space for adding signal calibration assemblies inside the device.

In addition, three positions C, D, and E in a dotted line frame in FIG. 4 represent schematic diagram of PD positions at an included angle with a vertical reference line, C, D, and E in an optical port 13 correspond to the positions of the front PDs one by one, it can be seen from the figure that when the included angle between the light splitting structure and the vertical reference line is zero, an optical path of light emitted by the device moves to the position D in the optical port 13, when the light splitting structure is rotationally increased along the clockwise direction, the optical path of light emitted by the device moves to the position C in the optical port 13, and when the light splitting structure is rotationally increased along the anticlockwise direction, the optical path of light emitted by the device moves to the position E in the optical port 13. This shows that the angle of the light splitting structure has a great influence on the optical path of the emitting light. The angle is generally selected to be 8°.

In addition, when the light splitting structure is added to the device, the medium of the optical path changes from air to other materials (such as glass), and a refractive index changes, then an offset (Offset amount) is generated on the optical path transmission, so that the light emitting position of the optical path may also appears in the C position or the E position.

Figure 5:
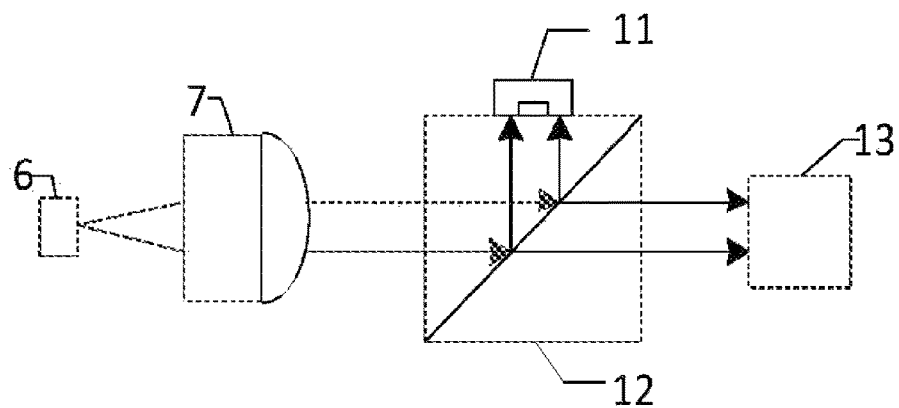
FIG. 5 is a front view showing a portion of an amplified optical path within a DML device associated with a monitoring unit and a light splitting structure.

FIG. 5 is a side view schematic diagram showing a portion of an amplified optical path within a device associated with a monitoring unit PD, the PD in the figure adopting a method of opening a window on a back side, and a photosensitive surface being located above the PD. In addition, it can be seen that a surface where a light splitting structure generates transmission and reflection of light is located on the surface formed by a diagonal line of an object, and when the thickness of the light splitting structure changes, the surface where transmission and reflection of light is generated also changes accordingly, then offset will occur in the transmitted and emitted light, and the transmitted and emitted light will also shift from the position D of the light emitting port to the position C and the position E.

FIG. 4 and FIG. 5 show the mode that the PD monitoring unit is prepositioned and is combined with the light splitting structure, which not only can realize the function of monitoring the current intensity of the laser, but also can change the parameters (thickness, refractive index or angle, etc.) of the light splitting structure according to requirements, so as to realize the adjustment of light emitting position.

Figure 6:
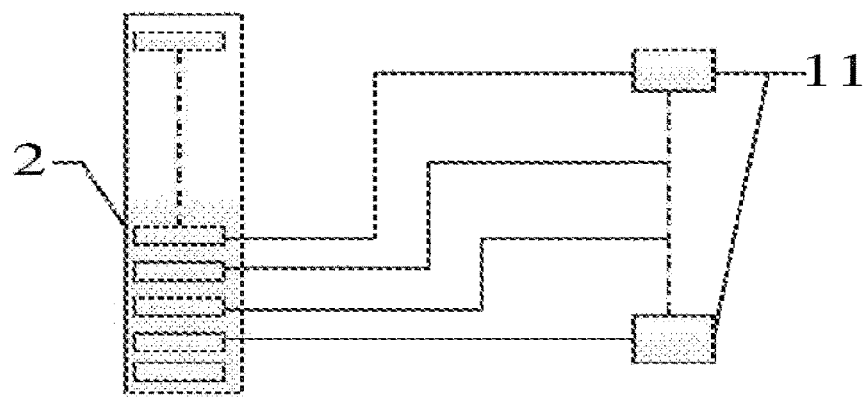
FIG. 6 is a schematic diagram showing a conventional multi-channel monitoring PD unit and its pin connections.

FIG. 6 is a schematic diagram of a conventional loading monitoring circuit, each monitoring circuit requires a corresponding pin definition on a ceramic substrate 2 of tube shell, this method is better when the number of monitoring circuit channels is small (less than or equal to 3), when the number of monitoring channels is large (larger than 3), the monitoring chips of N channels need to add N tube shell pins, which will increase the process difficulty of the device, and the increase of pins will occupy internal space of the device.

Figure 7:
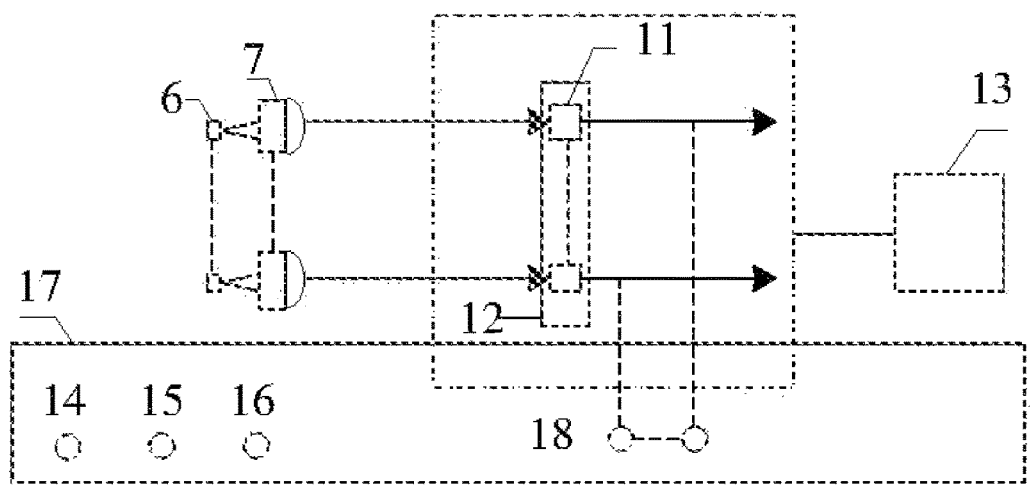
FIG. 7 is a schematic diagram showing the connection with a multi-channel monitoring PD unit and a serial control circuit.

FIG. 7 is a schematic diagram showing a connection with a multi-channel monitoring PD unit and a serial control circuit, wherein in a dotted box, a solid portion is parallel light, a dotted portion is a wire connecting the monitoring PD unit to an external serial port control structure 17. When the device includes multiple channels of monitoring units (greater than 3), in order to monitor the current intensity of each laser in the PD unit in real time, before monitoring the current intensity of the laser, PD array units are corresponded to data input ports 18 of the serial port control structure 17 one by one through the wire, and a clock signal and a voltage are loaded to a clock port 15 and a power port 16 of the serial port control structure 17, finally, all laser currents recorded by the PD are output at one time, if required, the PD array number corresponding to the data input port 18 may be selected therefrom. Compared with the method for recording laser current in the structure of FIG. 6, this structure is not only easy to realize due to the maturity of the serial port control structure, but also can reduce the number of pins of the device and save space for other elements inside the device.

The prepositioning mode used in the present embodiment is different from the conventional mode of placing laser intensity monitoring close to the back of the laser. The laser die diverges light whether it is forward or backward, and in the prior art, the backlight monitoring is placed at a position very close to the back of the laser die, so that the monitored photosensitive region can be within the light-emitting range of the laser, and in the present embodiment, the prepositioning mode in FIG. 3 to FIG. 5 is adopted, and the monitoring structure is placed in a position of the parallel light, and the monitored photosensitive region whether far or near to the laser chip is within the photosensitive effective range, and the structure can be adjusted to any convenient position as needed, and when there is a plurality of parallel light, there will be no more crosstalk between the different backlight monitoring.

Moreover, the prepositioning mode adopted in this embodiment is also different from the prepositioning structure placed at the exit of a waveguide, wherein the waveguide is a fixed medium and limited by accuracy, and has a very low yield rate. And a plurality of PDs are placed among a plurality of parallel light, and the parallel light can arbitrarily shift offsets through the structure, when the amount of displacement is required to be increased, it is only necessary to increase the angle or thickness of this structure or reduce the refractive index, when the amount of displacement is required to be reduced, only the reverse configuration is required; meanwhile, the structure is not limited in the air by the processing precision of a medium similar to the waveguide and the like, and the "free space" is really realized.

Figure 8:
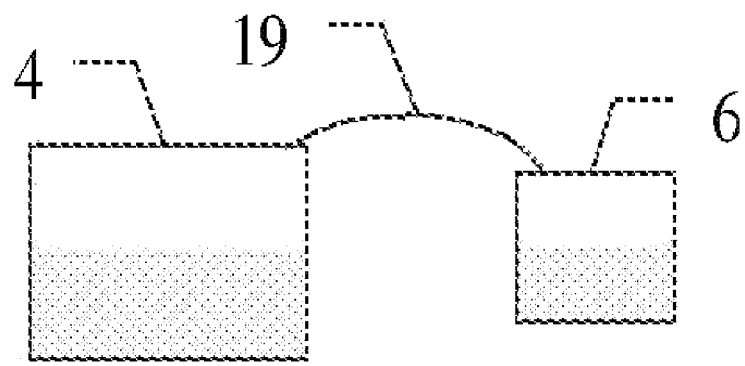
FIG. 8, FIG. 9, and FIG. 10 are schematic diagrams showing a gold wire connection between a signal calibration circuit and a laser chip.
Figure 9:
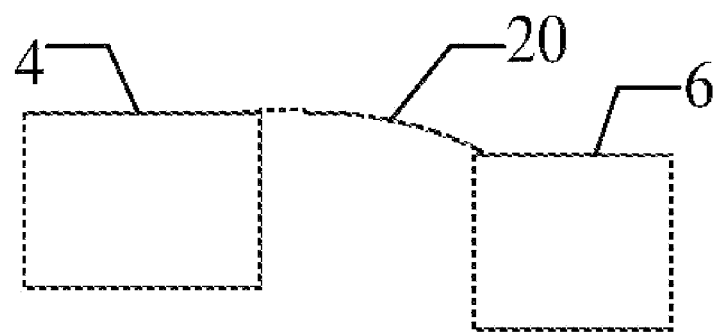
Figure 10:
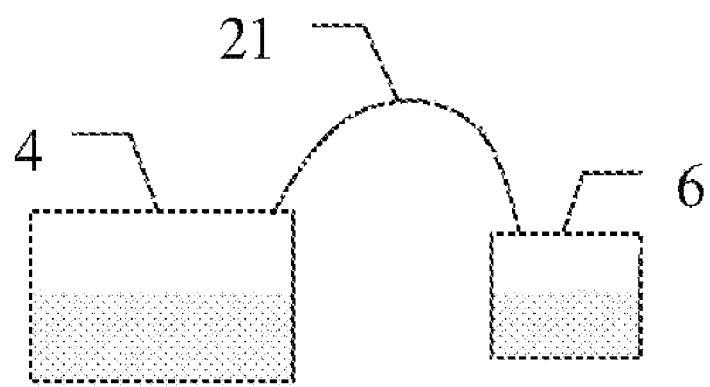

FIG. 8 to FIG. 10 are schematic diagrams showing a gold wire connection between the signal calibration circuit 4 and the laser chip 6 inside the device, the length and curvature of a first gold wire 19 in FIG. 8 are both appropriate, and the signal quality is very good, the length of a second gold wire 20 in FIG. 9 is appropriate, but the curvature is not appropriate, and the signal quality is very poor, and the curvature of a third gold wire 21 in FIG. 10 is appropriate, but the length is not appropriate, and the signal quality is very poor. Therefore, a reasonable control of the length and curvature of gold wire may improve the signal quality.

It is recommended that a reasonable control range of the gold wire bonding length between the signal calibration circuit 4 and the laser chip 6 of the device is 0.1 mm to 2 mm, and a control range of the bending angle is between 45° and 135°.

As a monitoring unit, the PD elements are used to monitor the operating state of the laser chip (mainly the power size). Generally speaking, if a laser chip is to work properly to produce good lasers, it must ensure that its various parameters are within the allowable range, such as temperature, current, etc. If the light is too strong or too weak, the accuracy of the data will be affected, and the light intensity of the laser chip will decrease along with the rising of temperature under the condition of constant current, and will gradually decrease along with the rising of using time, therefore, a PD feedback signal should be used to automatically adjust the light intensity to reach the required constant value.

After adopting the above structure, the signal calibration function may be completed through high-integration multistage amplification, parameter configuration of the laser chip, and the bonding length and angle between the laser chip and the laser die.

Wherein the parameters of multistage amplifying circuit integrated in the signal calibration circuit 4 are configured as follows:

a voltage of the multistage amplifying circuit is configured between 3.2V and 3.8V, and when a rising and falling time of a signal is insufficient, the voltage is increased within the range;

a bias current is configured between 20 mA and 45 mA, and when a extinction ratio value is very small, the bias current is adjusted to be lower, and when the extinction ratio value is very large, the bias current is adjusted to be higher;

a modulation current is configured between 30 mA-50 mA, and when an eye diagram margin is very low, the modulation current is increased; otherwise, the current is decreased;

an intersection point is configured between 40 and 60, and when a rising time is insufficient, the intersection point is adjusted to be lower, and when a falling time is insufficient, the intersection point is adjusted to be higher.

an equalization adjustment value is configured between 2 and 40, and when noise occurs on the left side of the eye diagram, an A-type equalization mode is configured, when noise occurs on the right side of the eye diagram, a B-type equalization mode is configured; when noise is very small, the equalization value is configured very small, and when noise is very large, the equalization value is configured very large;

because the above parameters are mutually influenced, when the signal quality of a certain aspect is adjusted by one or several parameters, the signal quality of other aspects may become worse. Through the above calibration method, most of the problems of signal quality degradation can be solved.

In addition to calibrating a degraded signal, the length and curvature of the gold wire bonding can effectively limit the extent of signal degradation, and when the parameters of the gold wire bonding are properly configured, the signal will not be excessively degraded, then the above-mentioned configuration of the amplification circuit has played a beneficial role.

The parameters of gold wire for the gold wire bonding are as follows: the length is controlled from 0.1 mm to 2 mm, and the bending angle is controlled between 45° and 135°. Through the setting and combination of the above parameters, a high-quality output signal under dual modulation frequencies of 25 Gbps and 28 Gbps can be finally achieved.

The output quality of signals can be remarkably improved when the present embodiment is applied to a 100 G device, however, it should be emphasized that the solution in the present embodiment is not limited to the 100 G device, and is also applicable to non-100 G high-speed devices and modules.

The specific embodiments described herein are merely illustration of the spirit of the present invention. Those skilled in the art to which the present invention belongs can make various modifications or supplements to the described specific embodiments or replace them in a similar mode without departing from the spirit of the present invention or exceeding the scope defined in the appended claims.

Although the following terms i.e. 1—tube shell; 2—ceramic substrate; 3—tube cover; 4—signal calibration circuit; 5—transition block; 6—laser chip; 7—collimating lens; 8—glass gasket; 9—heat sink; 10—independent temperature control element; 11 PD array; 12—light splitting structure; 13—converging lens; 14—data output port; 15 clock port; 16—power port; 17—serial port control structure; 18—data input port; 19—first gold wire; 20—second gold wire; 21—third gold wire and other terms are used more frequently herein, however, the possibility of using other terms is not excluded. These terms are only used to more easily describe and explain the nature of the present invention; it is against the spirit of the present invention to interpret them as any additional restriction.

What is claimed is:

1. A dual-rate directly modulated semiconductor laser (DML) device having a built-in signal calibration circuit, characterized in comprising:
    a signal calibration circuit is which is built into the DML device for calibrating a degraded signal and directly connected to a laser chip through a gold wire,
    a collimating lens for converting a light source of the laser chip into parallel light;
    a light splitting structure for reflecting and converging a portion of the parallel light onto a PD photosensitive surface; and
    a PD array comprising a plurality of said PD photosensitive surfaces, each of the PD photosensitive surfaces being respectively connected to a data input port of a serial port control structure, the serial port control structure being connected with the signal calibration circuit for driving the laser chip.

2. The dual-rate DML device having a built-in signal calibration circuit of claim 1, characterized in that,
    a surface, generating transmission and reflection of light, of the light splitting structure is located on an inclined surface formed by a diagonal line, and
    the PD array is located above the inclined surface.

3. The dual-rate DML device having a built-in signal calibration circuit of claim 1, characterized in that, a gold wire bonding length between the signal calibration circuit and the laser chip is 0.1 mm to 2 mm, and a bending angle is between 45° and 135°.

4. The dual-rate DML device having a built-in signal calibration circuit of claim 1, characterized in that, the light splitting structure is also used to transmit and converge a portion of the parallel light into an optical fiber.

5. The dual-rate DML device having a built-in signal calibration circuit of claim 1, characterized in that, the dual-rate DML device further comprises a heat sink connected to an independent temperature control element TEC, the laser chip, the collimating lens, and the PD array being successively arranged on the heat sink, and a glass gasket being set between the collimating lens and the heat sink.

6. A dual-rate directly modulated semiconductor laser (DML) module having a built-in signal calibration circuit, characterized in comprising a dual-rate DML device having a built-in signal calibration circuit, which comprises:
    a signal calibration circuit built into the DML device for calibrating a degraded signal and directly connected to a laser chip through a gold wire;
    a collimating lens for converting a light source of the laser chip into parallel light;

a light splitting structure for reflecting and converging a portion of the parallel light onto a PD photosensitive surface; and a PD array comprising a plurality of said PD photosensitive surfaces, each of the PD photosensitive surfaces being respectively connected to a data input port of a serial port control structure, the serial port control structure being connected with the signal calibration circuit for driving the laser chip.

7. A signal calibration method for a dual-rate directly modulated semiconductor laser (DML) device having a built-in signal calibration circuit, characterized in comprising:

a light splitting step, converting a light source of a laser chip into parallel light, and reflecting and converging a portion of the parallel light onto a PD array, wherein a PD photosensitive surface of the PD array is respectively connected to a data input port of a serial port control structure; and a feedback control step, deriving a signal from the PD array using the serial port control structure and delivering the signal to a signal calibration circuit, built into the DML device, directly connected to the laser chip via a gold wire to adjust light intensity.

8. The signal calibration method of a dual-rate DML device having a built-in signal calibration circuit of claim 7, characterized in that, in the feedback control step, the signals from the PD array are all output by a clock signal loaded on a clock port of the serial port control structure and a voltage loaded on a power port.

9. The signal calibration method of a dual-rate DML device having a built-in signal calibration circuit of claim 7, characterized in that, in the feedback control step, the signals from the PD array are read in time sequence.

\* \* \* \* \*